(12) United States Patent
Nguyen

(10) Patent No.: US 6,917,248 B2
(45) Date of Patent: Jul. 12, 2005

(54) BROADBAND VOLTAGE CONTROLLED OSCILLATOR SUPPORTING IMPROVED PHASE NOISE

(75) Inventor: Glao M. Nguyen, Ottawa (CA)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 10/197,606

(22) Filed: Jul. 18, 2002

(65) Prior Publication Data
US 2004/0012450 A1 Jan. 22, 2004

(51) Int. Cl.[7] ............................................. H03B 5/12
(52) U.S. Cl. ........................... 331/117 R; 331/177 V; 331/177 D
(58) Field of Search ................................ 331/16, 36 C, 331/177 D, 113 R, 117 R, 177 V, 175

(56) References Cited

U.S. PATENT DOCUMENTS

| | | | | |
|---|---|---|---|---|
| 4,904,964 A | * | 2/1990 | Peng et al. ................... | 332/123 |
| 4,918,406 A | * | 4/1990 | Baumbach et al. ...... | 331/117 R |
| 4,999,589 A | * | 3/1991 | DaSilva ................... | 331/117 R |
| 5,694,092 A | * | 12/1997 | Oba et al. ................ | 331/117 R |
| 6,204,734 B1 | | 3/2001 | Zhang et al. ............ | 331/117 R |
| 6,268,778 B1 | * | 7/2001 | Mucke et al. ............ | 331/117 R |
| 6,323,736 B2 | * | 11/2001 | Janson ..................... | 331/117 R |
| 6,545,555 B1 | * | 4/2003 | Justice et al. ........... | 331/117 R |
| 6,621,364 B2 | * | 9/2003 | Grewing et al. ......... | 331/117 R |
| 6,650,195 B1 | * | 11/2003 | Brunn et al. ............. | 331/177 V |
| 2003/0076139 A1 | * | 4/2003 | Miyagawa et al. ......... | 327/156 |

FOREIGN PATENT DOCUMENTS

EP 0899866 * 3/1999

OTHER PUBLICATIONS

A.M. Niknejad, J.L. Tham, and R.G. Meyer, "Fully–Integrated Low Phase Noise Bipolar Differential VCOs at 2.9 and 4.4 GHz", Proceedings of the 25th European Solid–State Circuits Conference, 1999, p. 198–201.

A. Kral, F. Behbahani and A.A. Abidi, "RF–CMOS Oscillators with Switched Tuning", IEEE 1998 Custom Integrated Circuits Conference, p. 555–558.

* cited by examiner

Primary Examiner—Dinh T. Le
(74) Attorney, Agent, or Firm—Freedman & Associates

(57) ABSTRACT

VCO (voltage controlled oscillator) circuits typically exhibit a frequency dependent variation in their output signal with respect to a tuning voltage applied to a tuning port on the VCO circuit. For a fixed tuning voltage the VCO circuit forms a stable oscillator. However, the stable oscillator formed is susceptible to both internal and external noise sources. Forming a VCO circuit from components such as varactors facilitates frequency stability and decreased noise susceptibility of the VCO circuit. A VCO formed from such components advantageously uses a summed capacitance of two or more varactors to provide decreased phase noise. Using a summed capacitance of the varactors reduces changes in output signal frequency with respect to changes in tuning voltage and thereby reduces the effects of noise by reducing a slope of this dependence.

5 Claims, 9 Drawing Sheets

BROADBAND VOLTAGE CONTROLLED OSCILLATOR SUPPORTING IMPROVED PHASE NOISE

FIELD OF THE INVENTION

This invention relates to the area of increasing tuning voltage ranges for variable capacitive elements and more specifically in the area of increasing tuning voltage ranges for variable capacitive elements used in voltage controlled oscillators.

BACKGROUND OF THE INVENTION

A voltage-controlled oscillator (VCO) is a well known electrical component. VCOs are utilized within many synthesizer and tuner circuits, such as those found in TVs and in wireless communication devices. Greater VCO stability with respect to noise sources provides for a more stable VCO output signal, thus for instance, enabling extraction of data from a multiplexed electrical signal. For electronic applications it is desirable to have a broadband voltage controlled oscillator that provides a wide frequency coverage output signal while having low phase noise.

In the prior art, such as in U.S. Pat. No. 6,204,734, entitled "Method and apparatus for extending a VCO tuning range," an LC resonant tank circuit comprising an inductor and a capacitor is disclosed. This LC resonant tank circuit provides an oscillating circuit within the VCO. The quality factor (Q) of the LC resonant tank circuit is dependent upon the Q of the components making up the LC resonant tank circuit. The LC resonant tank circuit largely determines the phase noise of the VCO, where the higher the Q of the LC resonant tank circuit the lower the phase noise on the output signal. It is known to those of skill in the art that spectral purity of the output signal and RMS phase error are important parameters to consider when designing, for instance, communication systems utilizing VCOs.

A CMOS varactor is a good choice for use as the capacitive element within the VCO LC resonant tank circuit because of its high Q. The varactor is a component that has a voltage dependent capacitance. The voltage dependent capacitance is dependent upon a potential difference applied to the varactor bias and tuning ports, where this voltage dependent capacitance is used to tune the output signal frequency of the VCO. The Q of the varactor is typically larger than the Q of the integrated inductors. Therefore, the phase noise of the VCO is often limited not by the CMOS varactor but rather by the Q of the on-chip inductor. This makes the CMOS varactor a suitable choice for use in the LC tank. Moreover, the CMOS varactor is a device that is readily available in many BiCMOS technologies because it is based on the same fabrication steps as the CMOS device.

Unfortunately, CMOS varactors are tuneable over a limited tuning voltage range, typically the tuning voltage ($V_T$) is varied in the range from a Vbias voltage of Vbias–0.7V to Vbias+1V. Over this $V_T$ range the capacitance of the varactor typically varies in a monotonic fashion in response to monotonically increasing $V_T$ applied to the tuning port. Design of varactors permits a smaller or larger capacitance change with respect to a same tuning voltage range, however when the capacitance change is larger, noise within $V_T$ introduces proportionately more noise into the VCO output signal than with a smaller capacitance changes. If the capacitance of the varactor changes greatly with only small differences in applied $V_T$, then the noise superimposed on the bias or tuning ports will cause commensurate fluctuations in the capacitance and furthermore on the VCO output signal. As such, if a broadband VCO is tuned over a large output signal frequency range then the VCO output signal sensitivity to both internal and external noise sources is increased, especially towards higher output signal frequencies.

Phase noise largely results from internal noise within the LC resonant tank circuit. The internal noise typically originates from resistor and transistor components located inside the LC resonant tank circuit portion of the VCO. External noise is derived from any noise source connected to a VCO tuning port as well as power supply noise originating from a power supply connected thereto. The output signal frequency of the VCO is proportional to $K_{VCO} * V_T$, where $K_{VCO}$ is the slope of the output signal frequency variation with respect to $V_T$ variations. As a result, if the LC resonant tank circuit within the VCO has a higher $K_{VCO}$ then the resulting effects of the noise arising from $V_T$ are multiplied by the $K_{VCO}$ term. Ideally the VCO has a low $K_{VCO}$, however the lower the $K_{VCO}$ of the VCO circuit the smaller the broadband response of the VCO. Thus a tradeoff exists between VCO output signal frequency range and noise immunity.

A need therefore exists to provide a VCO circuit that has a wide range output signal with reduced phase noise. It is therefore an object of the invention to provide a broadband VCO circuit that generates a frequency varying output signal with reduced phase noise in response to a tuning voltage applied within a tuning voltage range.

SUMMARY OF THE INVENTION

In accordance with the present invention there is provided a variable capacitance circuit comprising: a first variable capacitive element having a varying capacitance within a first capacitance range; a second variable capacitive element having a varying capacitance within a second capacitance range in parallel with the first variable capacitive element for in conjunction with the first variable capacitive element providing a summed capacitance; a biasing circuit for providing a first bias voltage to the first variable capacitive element and for providing a second bias voltage to the second variable capacitive element; and, a tuning voltage circuit for providing a tuning voltage to each of the first and second variable capacitive elements, wherein the potential difference between the tuning voltage applied to the first variable capacitive element and the first bias voltage is different from the potential difference between the tuning voltage applied to the second variable capacitive element and the second bias voltage.

In accordance with an aspect of the present invention there is provided a method of tuning a voltage controlled oscillator having an output signal that oscillates within a range of frequencies comprising the steps of: providing a stable oscillating circuit including two variable capacitive elements disposed for summing their capacitance, the stable oscillating circuit for providing an oscillating signal at a frequency relating to a summed capacitance of the stable oscillating circuit; varying a capacitance of a first variable capacitive element and other than substantially varying a capacitance of a second variable capacitive element in response to at least a control signal; varying a capacitance of the second variable capacitive element and other than substantially varying a capacitance of the second variable capacitive element in response to the at least a control signal; wherein the stable oscillating circuit provides an oscillating signal changing in frequency monotonically in response to monotonically changing the at least a control signal.

In accordance with an aspect of the present invention there is provided a method of providing a variable capacitance comprising the steps of: providing a first variable capacitive element for receiving a first voltage potential thereacross and having a first variable capacitance which varies within a first variable capacitance range in response to a variation in the first voltage potential; providing a second variable capacitive element in parallel with the first variable capacitive element for forming a summed variable capacitance therewith, for receiving a second voltage potential thereacross and having a second variable capacitance which varies within a second variable capacitance range in response to a variation in the second voltage potential for in combination with the first variable capacitive element supporting a summed capacitance range; and, providing the first and second voltage potentials across the first and second variable capacitive elements respectively such that the first and second potentials are different one from another.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF EMBODIMENTS OF THE INVENTION

Figure 1A:
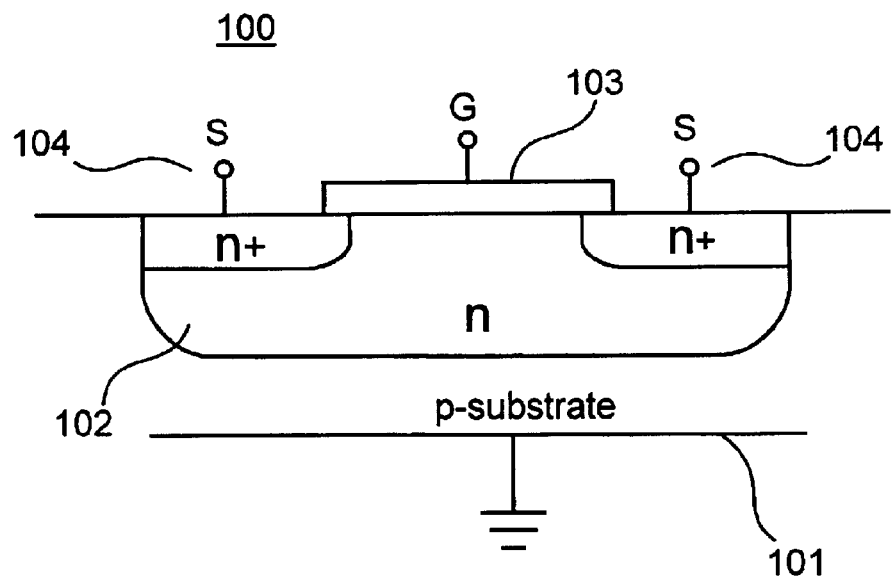
FIG. 1a illustrates a variable capacitive element in the form of a varactor.

FIG. 1a illustrates a variable capacitive element 100, in the form of a varactor, integrated within a p doped semiconductor substrate 101 using a CMOS or BiCMOS process. The p substrate is n doped 102 under a gate 103 with n+ doping regions under the source contacts 104 to permit improved conductivity. Typically when the varactor 100 is used in a circuit the p substrate 101 is grounded. Alternatively, The p substrate is n doped under an oxide isolating the gate contact from the well with n+ doping regions under the source contacts to permit improved conductivity.

Figure 1B:
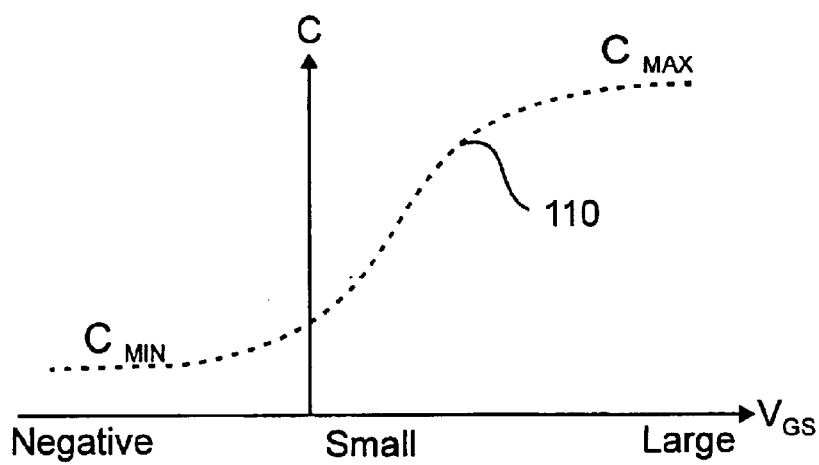
FIG. 1b illustrates a capacitance variation for a varactor in response to voltages applied to gate and source contacts of the varactor.

In FIG. 1b, a capacitance variation 110 for the varactor 100 is shown in response to voltages applied to the gate and source contacts of the varactor. The gate and source voltage applied to the varactor gate and source contacts, respectively, are with respect to ground. The capacitance variation of the varactor is dependent upon a potential difference between the gate and source voltages $V_{GS}$. The capacitance of the varactor varies from a minimum capacitance Cmin to a maximum capacitance Cmax in response to $V_{GS}$. If the gate voltage is lower than the source voltage then $V_{GS}$ is negative and a small varactor capacitance Cmin results. While the gate voltage is increased the capacitance of the varactor increases monotonically until the maximum capacitance Cmax. A continuous and monotonic capacitance variation is observed from Cmin to Cmax for various increasing $V_{GS}$ voltages applied to the varactor. The capacitance of the varactor varies as the magnitude and polarity of the applied voltage $V_{GS}$ shifts electrons within the MOS varactor structure between depletion and strong inversion.

Figure 1C:
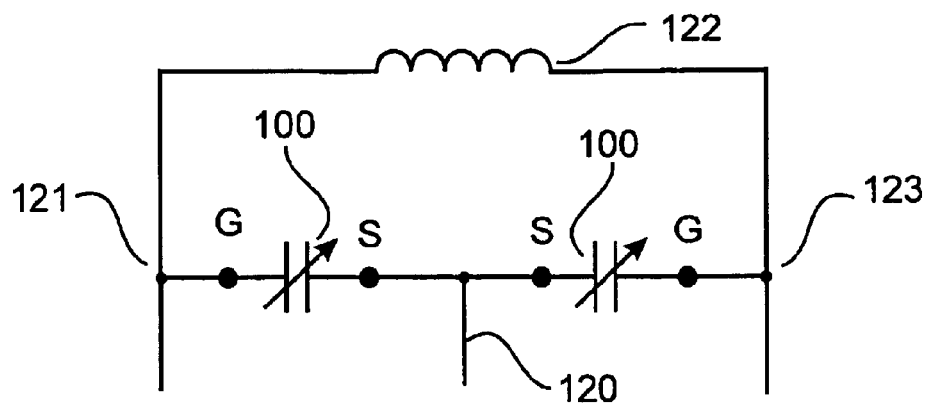
FIG. 1c illustrates a varactor when used in an LC tank portion of an oscillator circuit.

FIG. 1c illustrates the varactor when used in an LC tank portion of an oscillator circuit. In this case two varactors 100 are disposed in series with their source contacts coupled together to a tuning port 120. The gate contact of each varactor is coupled to a respective end of an inductor 122. Thus the gate contacts of the two varactors form varactor bias ports and the common coupled source contacts form a varactor tuning port. In this manner the two varactors, in series, are in parallel with the inductor 122. A bias voltage (Vbias) is applied to the gate contacts of each of the varactors through a first bias port 121 and a second bias port 123, collectively referred to as bias ports, and a tuning voltage ($V_T$) is applied to the tuning port 120. A potential difference between Vbias and $V_T$ provides the $V_{GS}$ voltage that is applied to each of the varactors.

Figure 1D:
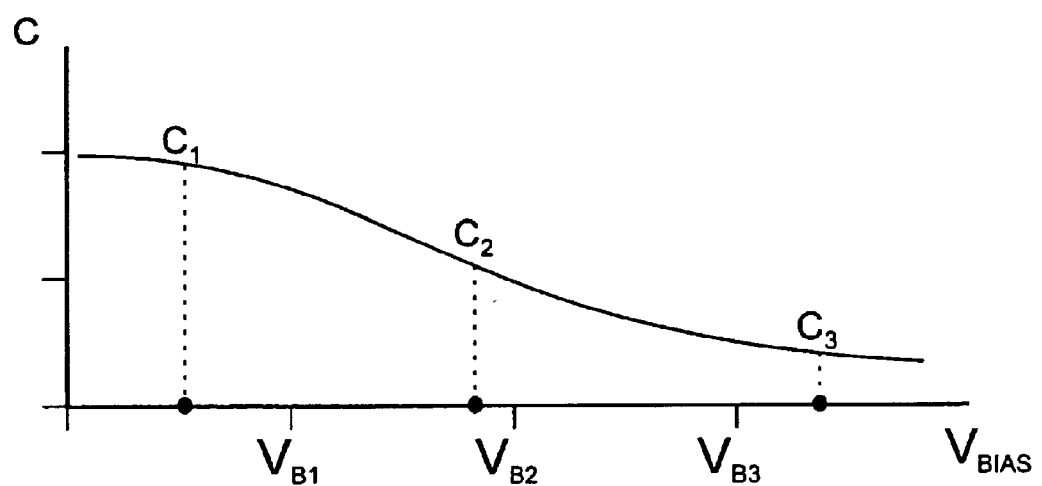
FIG. 1d illustrates a capacitance variation of two varactors with respect to a varying Vbias while maintaining a fixed $V_T$.

For the circuit shown in FIG. 1d, a capacitance variation of the two varactors is shown with respect to a varying Vbias while maintaining a fixed $V_T$. Varying Vbias creates changes in $V_{GS}$ applied to each of the varactors 100. At a first Vbias having a value of VB1, VB1 is greater than $V_T$ and therefore a larger $V_{GS}$ is observed on each varactor resulting in each varactor having a larger capacitance C1. For a Vbias of VB2, VB2 is closer to $V_T$ and as a result each of the varactors has a VGS of closer to zero and hence the capacitance C2 is smaller than that of C1. At a Vbias of VB3, VB3 is smaller than $V_T$ and a negative $V_{GS}$ is observed on each of the varactor, resulting in the capacitance C3 to be even less than that of C2. For variations in Vbias from VB1 to VB3 the capacitance of the varactors varies monotonically from C1 to C3. When Vbias is high with respect to $V_T$, then $V_{GS}$ is large and the capacitance approaches Cmax. As Vbias is decreased, $V_{GS}$ decreases until the capacitance reaches Cmin. Outside the VB1 and VB3 range the varactor capacitance variation ceases to have much of a capacitance variation when Vbias is decreased and increased, respectively, therefore the varactors are preferably operated within a range that facilitates monotonic capacitance variations with respect to variations in Vbias. Of course, instead of varying Vbias and keeping $V_T$ fixed, $V_T$ may be optionally variable with Vbias remaining fixed. Whether Vbias is varied and $V_T$ is fixed, or whether $V_T$ is varied and Vbias is fixed makes little difference, as long as the $V_{GS}$ applied to each of the varactors provides changes in magnitude and optionally magnitude and polarity.

Figure 2:
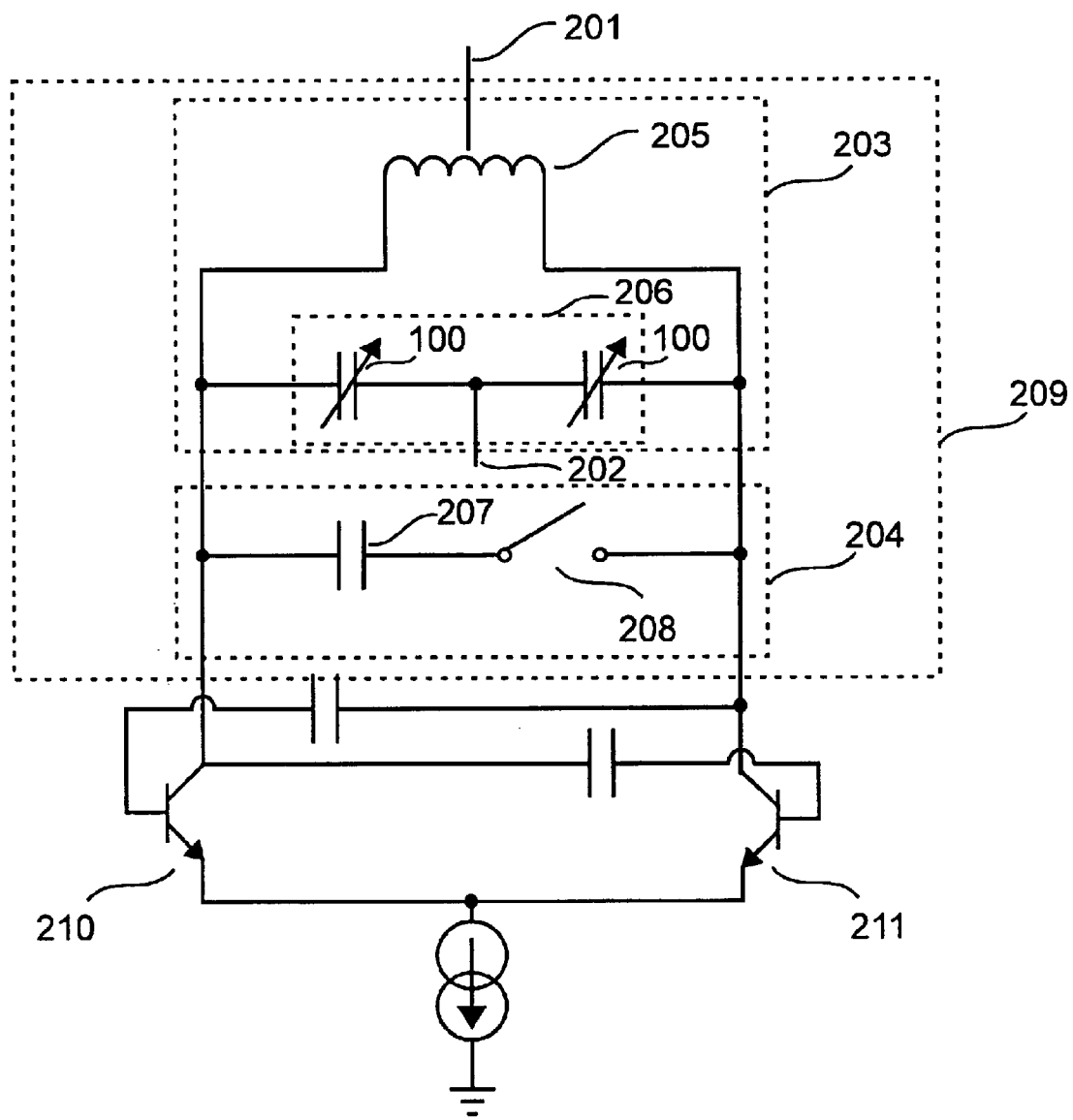
FIG. 2 illustrates a Prior Art VCO circuit.

Prior art FIG. 2 illustrates a VCO circuit 200 that utilizes a prior art design in order to reduce a frequency dependent variation in a VCO output signal. A LC resonant tank portion 209 of this prior art VCO circuit is divided into two banks.

A first bank 203 has a reactive component in the form of an inductor 205 and a first set of capacitive varying elements 206 in the form of serially coupled varactors 100 in parallel therewith. The inductor 205 is in the form of a symmetric center tap inductor having a center tap input port 201. The center tap input port 201 of the inductor is for receiving a bias voltage (Vbias) for the circuit. A second bank 204 has a capacitor 207 in series with a switch 208, and is disposed in parallel with the first bank 203. Both the first bank and the second bank form the LC resonant tank portion 209 of the VCO circuit. A tuning voltage input port 202 is provided on the LC resonant tank portion 209 in order to receive a tuning voltage $V_T$ and in order to provide this tuning voltage to the first and second banks. Transistors 210 and 211 are coupled to the LC resonant tank circuit 209. In use, an effective capacitance of each of the varactor when used in an oscillator circuit is dependent upon averaging an instantaneous varactor capacitance over a single oscillation period of the oscillator as each varactor varies its mode of operation between depletion and strong inversion.

In use, the VCO circuit 100 provides an oscillating output signal having a frequency that is dependent upon reactances of components within the LC resonant tank circuit 209, where it is known to those of skill in the art that for capacitor and inductor oscillating circuits the following relation describes the output signal frequency for a resistanceless oscillator:

$$\omega = \frac{1}{\sqrt{LC}}$$

Having switch 108 open results in primarily the inductor and the varactor within the first bank contributing to oscillations in the VCO output signal. Of course, the range of output signal frequencies covered by the first bank is dependent upon a capacitance variation of the varactor in response to variations in the $V_T$. As a result, when switch 208 is open the first set of capacitive varying elements 206 in the form of a first set of varactors 206 have a capacitance variation within a first capacitance range in response to a varying $V_T$ with a fixed Vbias. When switch 208 is closed the reactances of the first bank are summed with those of the second bank. A capacitance of the capacitor 207 is added in parallel to the instantaneous varactor capacitance of the first set of varactors 206 to form a summed capacitance. Adding this capacitance in parallel effectively shifts the summed capacitance, resulting in operation of the VCO circuit within a second capacitance range. Thus, in dependence upon the capacitance of the capacitor, the second capacitance range may overlap a portion of the first capacitance range when $V_T$ is varied with respect to Vbias within a same voltage range as was used prior to closing of switch 208.

Figure 3:
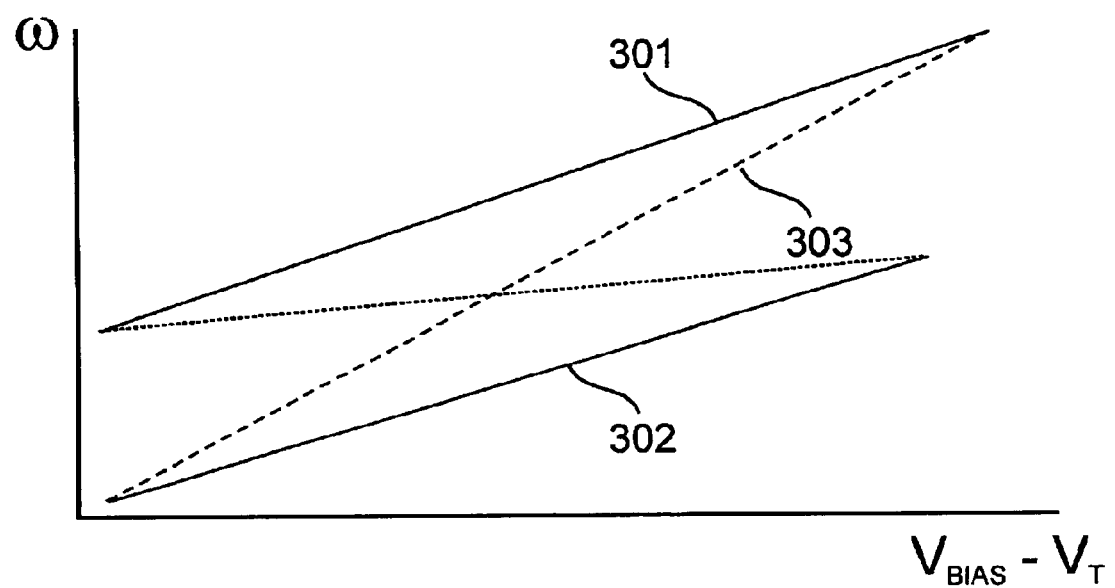
FIG. 3 illustrates how the prior art VCO circuit output signal frequency varies with respect to an applied tuning voltage.

FIG. 3 illustrates how the prior art VCO circuit 200 output signal frequency varies with respect to an applied $V_T$. With switch 208 open, the first bank within the LC resonant tank circuit operates within the first capacitance range and is responsible for providing an oscillating signal covering a range of frequencies within a first band and following a first curve 301 with respect to Vbias–$V_T$. With switch 208 closed the first and second banks within the LC resonant tank circuit are combined forming the summed capacitance and operating within the second capacitance range thereby providing an output signal covering a range of frequencies within a second band and along a second curve 302 with respect to Vbias–$V_T$. In combination switching between the first and second banks within the LC resonant tank portion provides for a VCO circuit that has a broadband output signal frequency coverage band without using varactors that operate within a larger capacitance range. Selecting of suitable capacitance values for the varactor and for the capacitor results in a VCO circuit that provides an output signal that varies continuously and monotonically with respect to Vbias–$V_T$. The VCO output signal frequency is inversely proportional to the summed capacitance, as the summed capacitance increases the VCO output signal frequency decreases. Hence, the first curve 301 covers frequencies within a range that are higher than frequencies covered by the second curve 302.

The $K_{VCO}$ of this VCO circuit 200 for a given range of capacitance change is approximately one half of the $K_{VCO}$ if a single varactor were used having a same range of capacitance change. $K_{VCO}$ is dependent upon the change of the output signal frequency with respect to the change in Vbias–$V_T$. Unfortunately the reduction in $K_{VCO}$ within this circuit results from the addition of a switching circuit and all the drawbacks, such as complexity and chip area, which are associated therewith. In particular, switching circuits introduce transition noise and switching delays. On the other hand, if a single varactor having an increased capacitance range is chosen a higher $K_{VCO}$ results. If this were the case then the $K_{VCO}$ would follow curve 303, covering the same output signal frequency range but having a steeper slope than curves 301 and 302.

Figure 4:
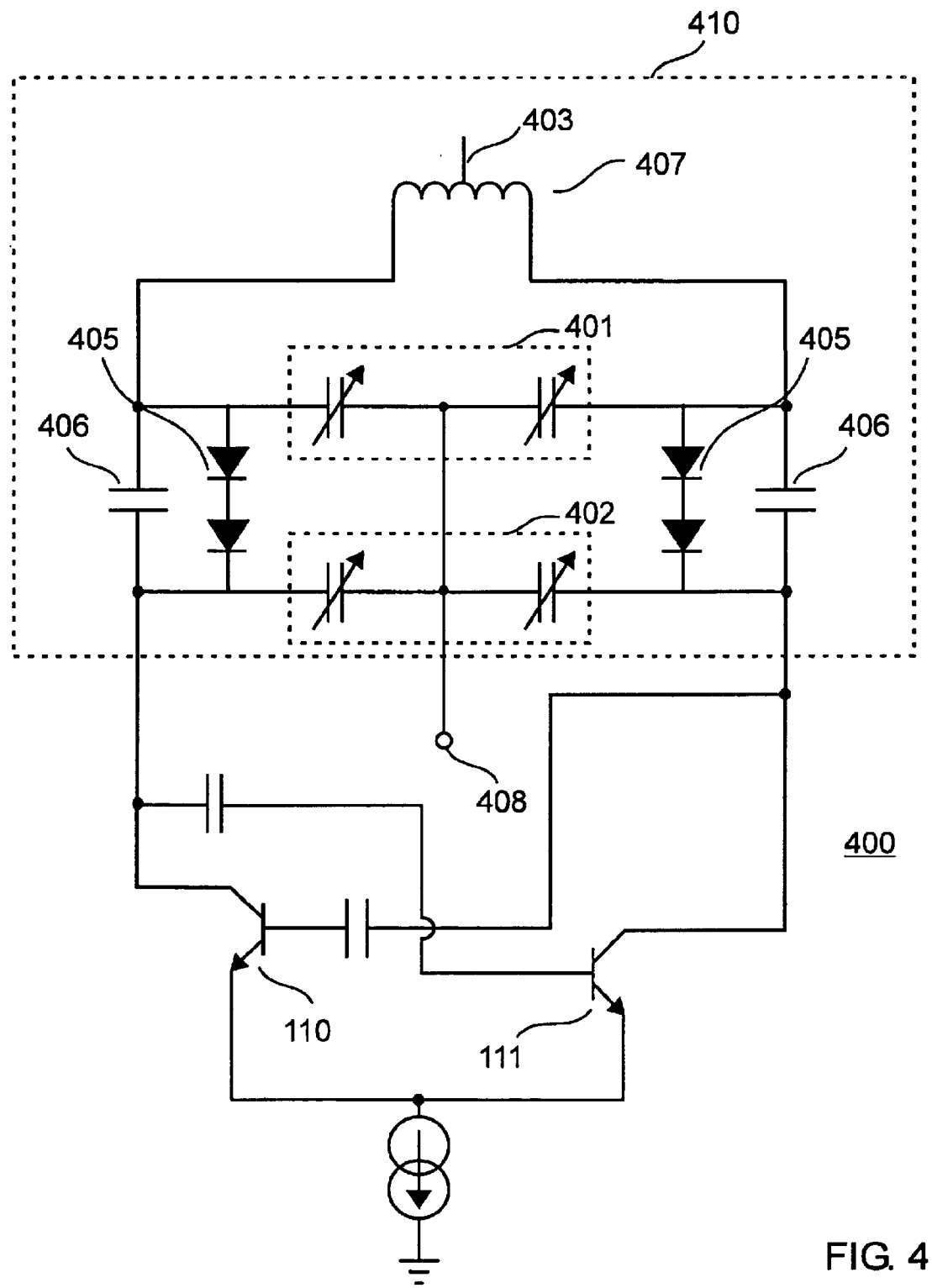
FIG. 4 illustrates a preferred embodiment of the invention, a VCO circuit utilizing two sets of varactors.

FIG. 4 illustrates a preferred embodiment of the invention, a VCO circuit 400 utilizing two sets of varactors, a first set 401 and a second set 402 and a reactive component in the form of an inductor 407 disposed within a LC resonant tank portion 410 of this circuit 400. Each set of varactors has two varactors serially coupled together via their source contacts with their gate contacts coupled to and disposed in parallel with the inductor 407. Inductor 407 is a symmetric center tap inductor having a bias port 403 for receiving Vbias for biasing of the first and second sets of varactors. The source contacts, areas of n+ diffusion, of the first set of varactors are coupled to a VCO tuning port 408 for receiving the $V_T$. A second set of varactors 402 is coupled in parallel to the first set of varactors 401 and inductor 407, via the gate contacts, serially disposed diodes 405 and blocking capacitors 406 in parallel. The second set of varactors 402 also have their source contacts coupled to the VCO tuning port 408 for receiving $V_T$.

In an embodiment the bias voltage applied to the bias port 403 of the inductor 407 is set to 2.5V. Thus 2.5V is applied to the bias port of the inductor and this voltage is also provided to the bias port of the first set of varactors 401. Diodes 405 provide a voltage drop from 2.5V to approximately 0.9V to bias the second set of varactors 402. Coupling capacitors 406 are used to ensure AC coupling between the two sets of varactors for predetermined operating frequencies of the LC resonant tank portion 410. In operation the coupling capacitors form AC short circuits from the second set of varactors 402 to the inductor at the predetermined operating frequencies. Of course, the value of these coupling capacitors is higher than that of the varactors so the series connection to the inductor from each of the varactors is primarily dependence by the capacitance of each of the varactors.

Figure 5:
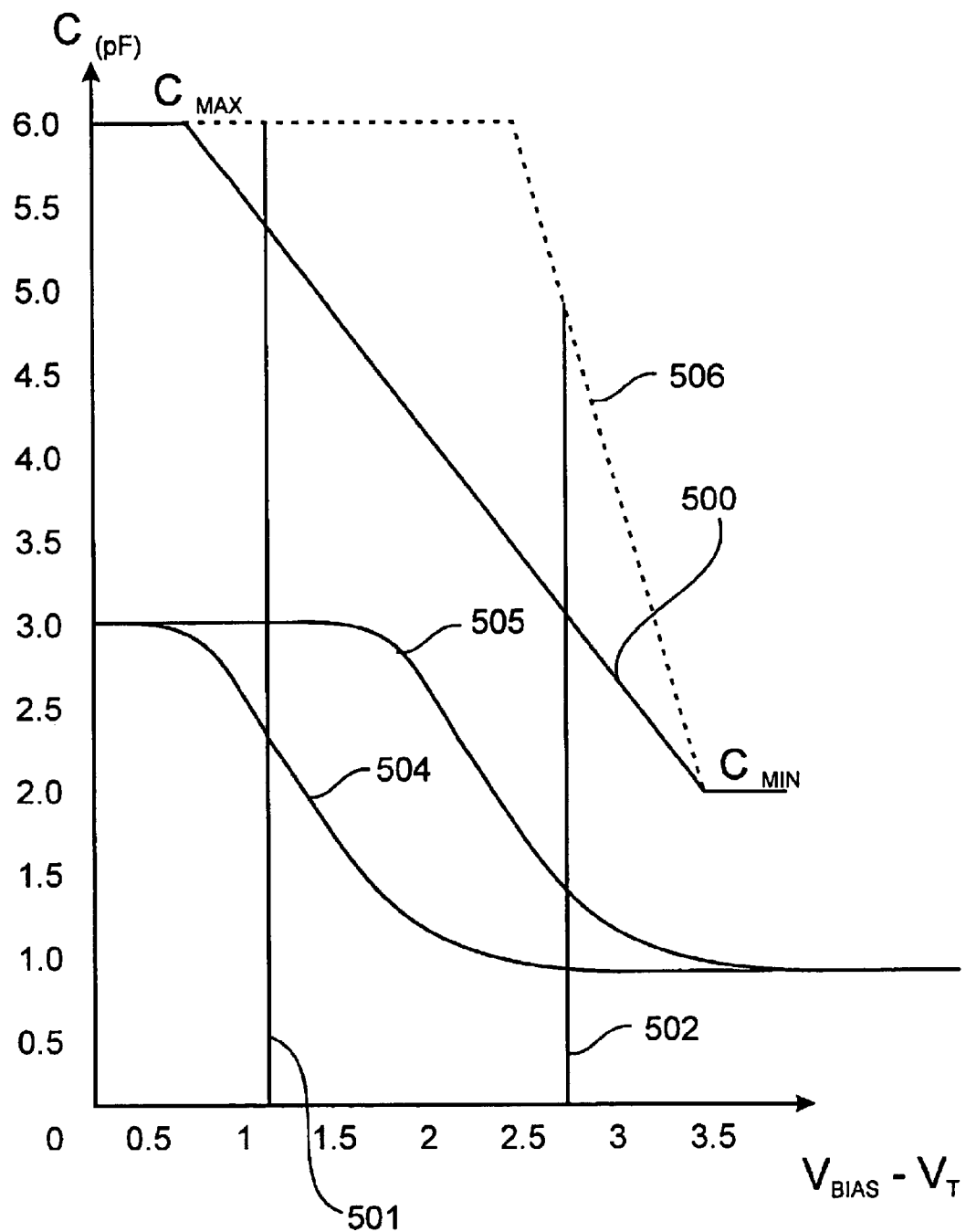
FIG. 5 illustrates a capacitance variation of the two sets of varactors plotted in a graph with respect to $V_T$.

In FIG. 5, capacitance variations of the two sets of varactors 401 and 402 are plotted in a graph with respect to $V_T$ applied to the tuning port of each set of varactors. The varactors sets are biased using voltages Vbias1 501 and Vbias2 502 applied to their bias ports. A voltage difference between $V_T$ and the bias voltages is the resulting $V_{GS}$ applied to each of the varactors within the first and second varactor sets.

For lower values of $V_T$, the varactors are biased in such a manner that the first varactor set 401 varies its capacitance 504 for an increasing tuning voltage 502 applied to the tuning port while the second varactor set capacitance 505 is approximately fixed. For higher $V_T$ the second varactor set 402 varies its capacitance 505 for a further increasing $V_T$ while the first varactor capacitance 504 is approximately fixed. As is seen from this graph a total continuous and decreasing capacitance 500 results when the capacitance of each varactor set is summed together for applied tuning voltages within the $V_T$ range from 0 to 3.7V.

Advantageously the sizes of each of the varactors within the two sets of varactors are chosen so that the summed capacitance 500 of each set has a value that has a same Cmax and Cmin as that of a single varactor set. As is illustrated in the graph of FIG. 5, it is possible to keep the same Cmax and Cmin values while using two varactor sets. Since two varactor sets are used, with their capacitance ranges summed at different bias points, it is possible for the total capacitance to vary to a lesser degree with respect to the applied $V_T$ and to still achieve the same extremes of capacitance variation. Effectively, by summing the capacitance of the two sets of varactors, a same VCO output signal frequency range is achieved using a wide $V_T$ range. Doubling the output signal frequency range for a same $V_T$ range increases the required $K_{VCO}$ by a factor of two. Again $K_{VCO}$ is the slope of the output signal frequency with respect to applied $V_T$ to the varactor sets. By using two varactor sets biased in a predetermined manner the slope of the summed capacitance with respect to tuning voltage is decreased. Since $K_{VCO}$ is decreased, the phase noise associated therewith is also reduced and greater immunity with respect to noise sources is facilitated. In contrast, if a single varactor set were used to provide the frequency varying output signal over the same range of $V_T$ then the $K_{VCO}$ would be approximately double 506 because the size of the varactors is doubled. Doubling the capacitance of the varactor within a set results in a sharper slope with a higher $K_{VCO}$ and therefore a higher phase noise.

Figure 6:
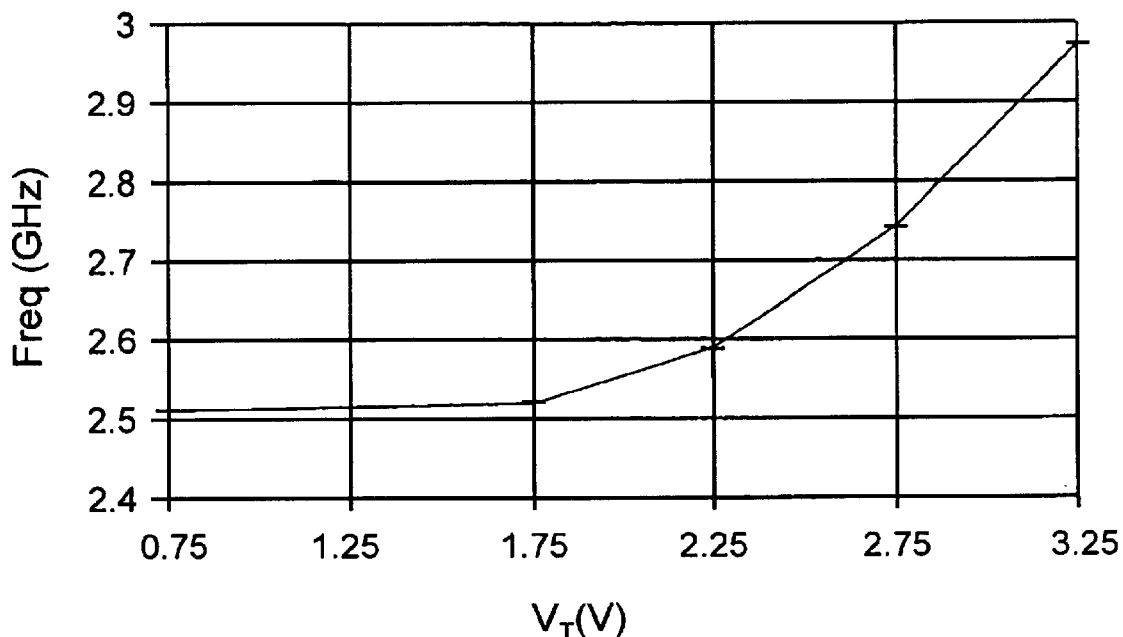
FIG. 6 illustrates a graph showing output signal frequency response for a VCO circuit having a tuning voltage varied over a tuning voltage range.

FIG. 6 illustrates a graph showing output signal frequency response for a VCO circuit having $V_T$ tuned over a $V_T$ range. The LC resonant tank portion of the circuit in this case is similar to that of the LC resonant tank portion within the prior art VCO circuit 200, where the LC resonant tank portion has a single set of varactors and a single inductor in parallel. The resulting curve exhibits a varying $K_{VCO}$ across the $V_T$ range. Unfortunately, the $K_{VCO}$ is higher for higher $V_T$ values than for lower $V_T$ values. Moreover, the frequency range from approximately 2.75 GHz to 3 GHz is achieved over a VT range of approximately 2.75V to 3.25V. This being indicative of a quite high $K_{VCO}$ as compared to almost no frequency variation from 0.75V to 1.25V.

Figure 7:
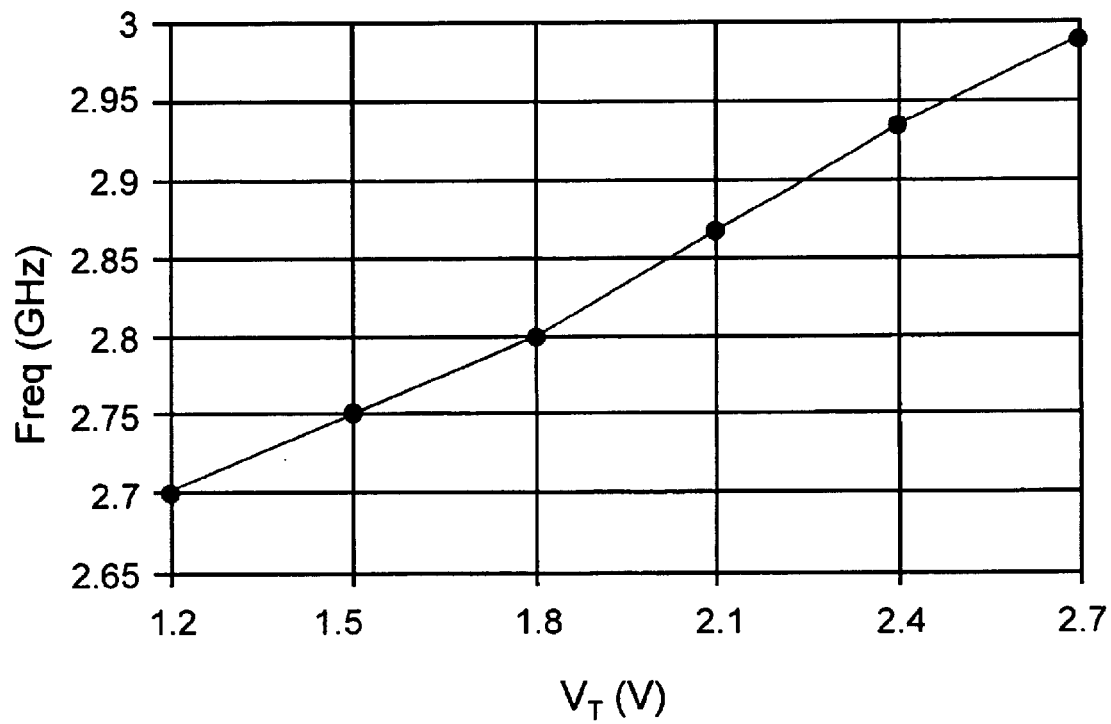
FIG. 7 illustrates how the output signal generated by the VCO circuit in accordance with the present embodiment provides a significant reduction in variations in $K_{VCO}$.

FIG. 7 illustrates how the output signal generated by the VCO circuit 400 in accordance with the present embodiment provides a significant reduction in variations in $K_{VCO}$ for when $V_T$ is tuned within the $V_T$ range. In this case, $K_{VCO}$ is fairly constant across the band from 1.2V to 2.7V with $K_{VCO}$ tending to decrease towards an upper limit of the $V_T$ range. Advantageously, by decreasing variation in $K_{VCO}$ with respect to $V_T$ the frequency response curve is optionally close to linear with respect to $V_T$ within this range.

Advantageously, the frequency overlap between the output signal frequencies contributed by the first and second varactor sets is determined by Vbias instead of capacitor tolerance, as done in prior art designs. The design of the VCO circuit in the preferred embodiment relies on Vbias1 501 and Vbias2 502 for biasing each of the varactor sets. By adjusting Vbias, varactor capacitance plays less of a dependence on the VCO output signal frequency.

Figure 8:
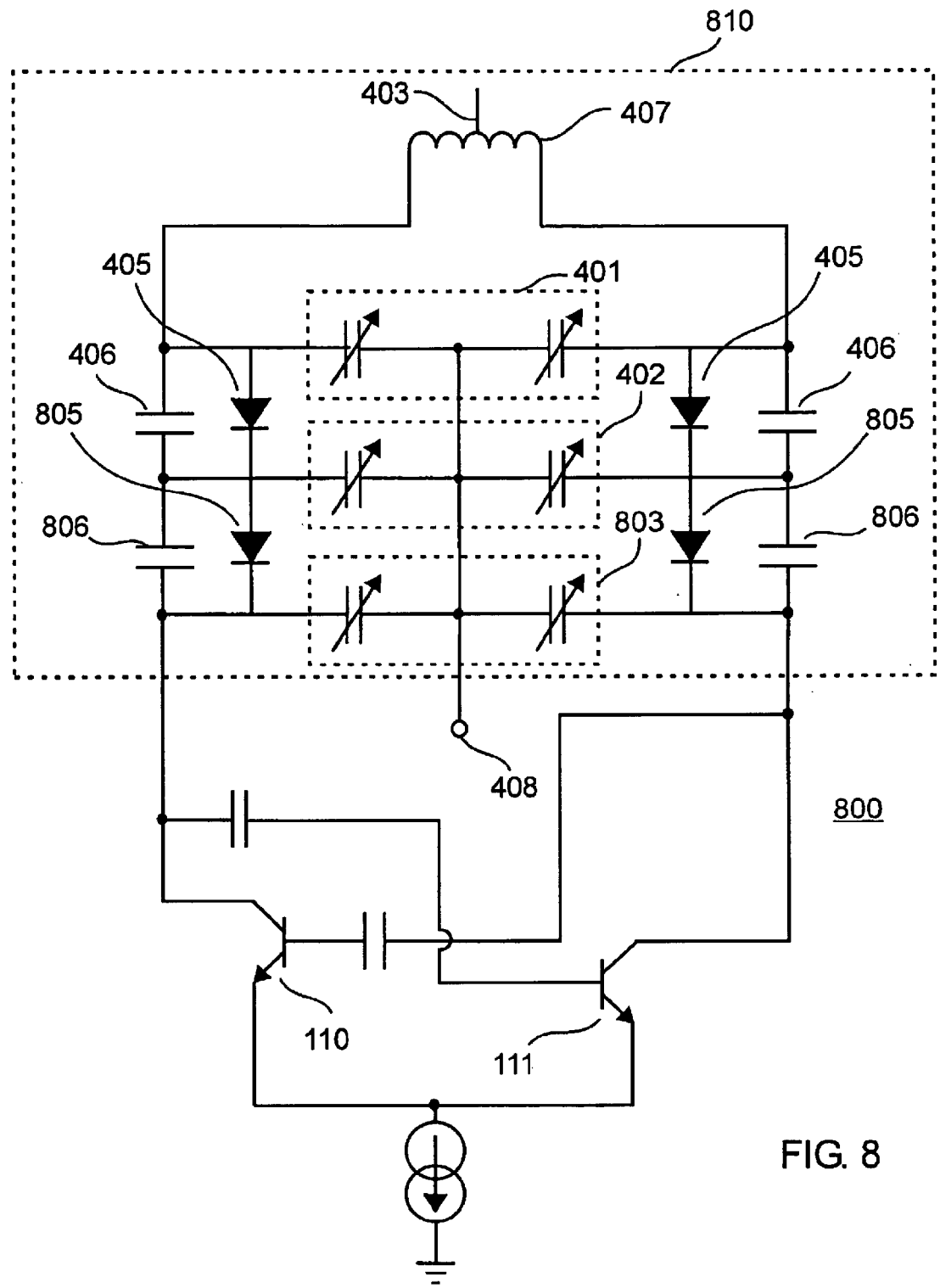
FIG. 8, illustrates a variation of an embodiment of the invention.

FIG. 8 illustrates a variation of an embodiment of the invention. In this case the LC resonant tank portion 810 of the VCO circuit 800 has a third varactor set 803 disposed in parallel with the first and second varactor sets. Diodes 805 and coupling capacitors 806 are disposed in parallel, and serially coupled to the bias ports of the third varactor set 803 in order to provide a desired bias voltage to the third varactor set. The source contacts of the varactors within the third varactor set are coupled to the VCO tuning port 408. By selecting bias voltages for each of the varactor sets, tuning of the output signal frequency response curve with respect to $V_T$ is further facilitated. In this case smaller capacitance varactors are chosen for use within each of the varactor sets and there are more of them utilized within the circuit, advantageously reducing $K_{VCO}$ even further.

Figure 9:
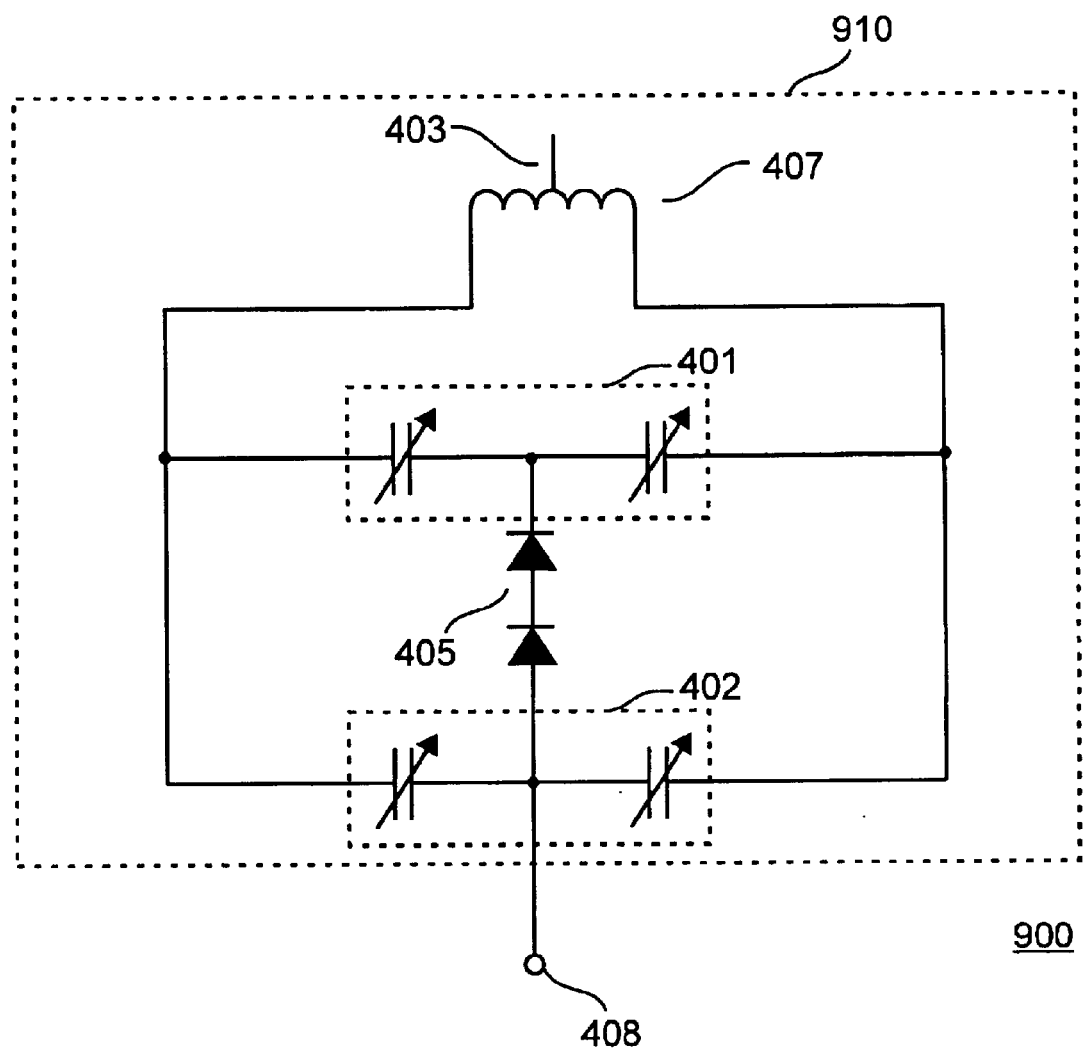
FIG. 9 illustrates another variation of an embodiment of the invention.

FIG. 9 illustrates another variation of an embodiment of the invention. In this VCO circuit variation 900, two sets of varactors 401 and 402 and a reactive component in the form of an inductor 407 are disposed within a LC resonant tank portion 910 of this circuit 900. The first varactor set 401 has its each of the varactor gate contacts coupled to a port on the inductor. The first varactor set thus disposed in parallel with the inductor 407. The tuning port, or gate contact, of this first varactor set is coupled through diodes 405 to a VCO tuning port 408. A second varactor set 402 is coupled in parallel to the first varactor set 401 and inductor 407. The gate contacts are coupled to ports on the inductor, via the gate contacts of each of the varactors. The second varactor set 402 has the source contacts of its varactors coupled via a tuning port to the VCO tuning port 408 for receiving $V_T$. Both varactors sets in this case are biased using a same biasing voltage, however the tuning voltage provided to each of the varactor sets is different. The $V_T$ provided to the first varactor set is voltage dropped after propagating through diodes 405 to provide a dropped $V_T$ to the second varactor set. Providing different tuning voltages to the two varactor sets results in the $V_{GS}$ voltages on each varactor within the different sets to be different and as a result causes the capacitance range of each of the varactors to be other than the same when the applied $V_T$ is varied and Vbias is fixed.

Of course those of skill in the art will be aware that $K_{VCO}$, Vbias, and $V_T$ are all design features and are optionally set in accordance with design parameters. Those values for the above mentioned variables provided herein are provided by way of example and are not intended to be limiting.

Numerous other embodiments may be envisaged without departing from the spirit or scope of the invention.

What is claimed is:

1. A variable capacitance circuit comprising:
   a first variable capacitive element having a varying capacitance within a first capacitance range;
   a second variable capacitive element having a varying capacitance within a second capacitance range disposed within a parallel circuit path with the first variable capacitive element for in conjunction with the first variable capacitive element providing a summed capacitance, which is a sum of the first capacitance of the first variable capacitive element and the second capacitance of the second variable capacitive element;
   a biasing circuit comprising:
      at least a diode disposed in series between the first and second variable capacitive elements; and,
      at least a coupling capacitor disposed in parallel with the diode, said coupling capacitor and said diode being in series between the first and second variable capacitive elements, for providing a first bias voltage to the first variable capacitive element and for providing a second bias voltage to the second variable capacitive element;

a tuning voltage circuit for providing a tuning voltage to each of the first and second variable capacitive elements;

an output port for providing an output signal; and, at least a reactive component disposed in parallel with the first and second variable capacitive elements and disposed in series with the coupling capacitors and the diodes for, with the summed capacitance arising therefrom, forming a stable oscillator when in use, wherein a first potential difference between the tuning voltage applied to the first variable capacitive element and the first bias voltage is different from a second potential difference between the tuning voltage applied to the second variable capacitive element and the second bias voltage, wherein a slope of the variation of the summed capacitance for the first and second variable capacitive elements is less than a slope of the variation of capacitance for a single variable capacitive element formed using a same semiconductor process, wherein the summed capacitance is dependent upon a magnitude and polarity of the tuning voltage applied to the first variable capacitive element and the first bias voltage and a magnitude and polarity of the tuning voltage applied to the second variable capacitive element and the second bias voltage, wherein an oscillating frequency of the output signal is dependent upon a reactance of the at least a reactive component and the summed capacitance, wherein said diode provides the difference between the first potential difference and the second potential difference.

2. A variable capacitance circuit comprising:

a first variable capacitive element having a varying capacitance within a first capacitance range;

a second variable capacitive element having a varying capacitance within a second capacitance range disposed within a parallel circuit path with the first variable capacitive element for in conjunction with the first variable capacitive element providing a summed capacitance, which is a sum of the first capacitance of the first variable capacitive element and the second capacitance of the second variable capacitive element;

a biasing circuit comprising:

at least a circuit element for providing a voltage drop disposed between the first tuning port and the second tuning port, wherein the voltage drop occurs across the at least a circuit element, resulting in other than a same voltage being applied to the first and second variable capacitive elements, wherein the biasing circuit is for providing a first bias voltage to the first variable capacitive element and for providing a second bias voltage to the second variable capacitive element;

a tuning voltage circuit for providing a tuning voltage to each of the first and second variable capacitive elements, an output port for providing an output signal; and, at least a reactive component disposed in parallel with the first and second variable capacitive elements for, with the summed capacitance arising therefrom, forming a stable oscillator when in use, wherein the summed capacitance is dependent upon a magnitude and polarity of the tuning voltage applied to the first variable capacitive element and the first bias voltage and a magnitude and polarity of the tuning voltage applied to the second variable capacitive element and the second bias voltage, and wherein an oscillating frequency of the output signal is dependent upon a reactance of the at least a reactive component and the summed capacitance, wherein a first potential difference between the tuning voltage applied to the first variable capacitive element and the first bias voltage is different from a second potential difference between the tuning voltage applied to the second variable capacitive element and the second bias voltage, wherein a slope of the variation of the summed capacitance for the first and second variable capacitive elements is less than a slope of the variation of capacitance for a single variable capacitive element formed using a same semiconductor process, wherein the at least a circuit element comprises a diode.

3. A method of tuning a voltage controlled oscillator having an oscillating output signal that oscillates within a range of frequencies comprising:

providing a stable oscillating circuit including two variable capacitive elements;

varying a first capacitance of a first variable capacitive element within a first capacitance range and other than substantially varying a second capacitance of a second variable capacitive element in response to a tuning voltage;

varying the second capacitance of the second variable capacitive element within a second capacitance range and other than substantially varying the first capacitance of the first variable capacitive element in response to the tuning voltage;

providing a coupling capacitor disposed in series between the first and second capacitive varying elements and using said coupling capacitor for AC coupling the first and the second capacitive varying elements within the stable oscillating circuit;

providing at least a diode disposed in parallel with the coupling capacitor and in series between said variable capacitive elements;

biasing said variable capacitive element using the at least a diode in order to provide other than a same bias voltage on the variable capacitive elements; and summing the first capacitance with the second capacitance to form a summed capacitance, the stable oscillating circuit for providing the oscillating output signal at a frequency relating to the summed capacitance, the oscillating output signal for changing in frequency monotonically in response to monotonically changing the tuning voltage, wherein summing the capacitance of the first and the second capacitive varying elements results in decreased phase noise of the oscillating output signal because the summed capacitance is dependent upon a sum of the capacitance of the first variable capacitive element within the first variable capacitance range and the second variable capacitive element, wherein the capacitance of the first variable capacitive element is substantially constant when the capacitance of the second variable capacitive element is changing and wherein the capacitance of the second variable capacitive element is substantially constant when the capacitance of the first variable capacitive element is changing and wherein in a variable capacitance range either the capacitance of the first variable capacitive element or the second variable capacitive element is changed in response to a change in the tuning voltage.

4. A method of providing a variable capacitance comprising:

providing a first variable capacitive element for receiving a first voltage potential thereacross and having a first variable capacitance which varies within a first variable capacitance range in response to a variation in the first voltage potential;

providing a second variable capacitive element disposed within a parallel circuit path with the first variable capacitive element for forming a summed variable capacitance therewith, for receiving a second voltage potential thereacross and having a second variable capacitance which varies within a second variable capacitance range in response to a variation in the second voltage potential for in combination with the first variable capacitive element supporting a summed capacitance range;

providing the first and second voltage potentials across the first and second variable capacitive elements respectively such that the first and second potentials are different one from another;

providing a coupling capacitor disposed in series between the first and second capacitive varying elements; and, using said coupling capacitor for AC coupling the first and the second capacitive varying elements;

providing at least a circuit element for providing a voltage drop disposed in parallel with the blocking capacitor and in series between said variable capacitive elements; and, biasing said variable capacitive element using the at least a circuit element for providing a voltage drop in order to provide other than a same bias voltage on the variable capacitive elements.

5. A method according to claim 4, wherein the at least a circuit element for providing a voltage drop comprises a diode.

* * * * *

UNITED STATES PATENT AND TRADEMARK OFFICE
CERTIFICATE OF CORRECTION

| | | |
|---|---|---|
| PATENT NO. | : 6,917,248 B2 | Page 1 of 1 |
| APPLICATION NO. | : 10/197606 | |
| DATED | : July 12, 2005 | |
| INVENTOR(S) | : Giao M. Nguyen | |

It is certified that error appears in the above-identified patent and that said Letters Patent is hereby corrected as shown below:

On the Title Page, Item (75) Inventor, "Glao" should read --Giao--

Signed and Sealed this
Fifth Day of April, 2011

David J. Kappos
*Director of the United States Patent and Trademark Office*